United States Patent
Misumi et al.

(10) Patent No.: US 11,167,357 B2
(45) Date of Patent: Nov. 9, 2021

(54) SURFACE-COATED CUTTING TOOL

(71) Applicant: SUMITOMO ELECTRIC HARDMETAL CORP., Itami (JP)

(72) Inventors: Shuhei Misumi, Sorachi-gun (JP); Haruyo Fukui, Sorachi-gun (JP); Shinya Imamura, Sorachi-gun (JP); Kazuhiro Hirose, Sorachi-gun (JP); Hiroki Takeshita, Sorachi-gun (JP)

(73) Assignee: Sumitomo Electric Hardmetal Corp., Itami (JP)

( * ) Notice: Subject to any disclaimer, the term of this patent is extended or adjusted under 35 U.S.C. 154(b) by 508 days.

(21) Appl. No.: 16/092,499

(22) PCT Filed: Mar. 3, 2017

(86) PCT No.: PCT/JP2017/008498
§ 371 (c)(1),
(2) Date: Oct. 10, 2018

(87) PCT Pub. No.: WO2017/183327
PCT Pub. Date: Oct. 26, 2017

(65) Prior Publication Data
US 2019/0160546 A1    May 30, 2019

(30) Foreign Application Priority Data

Apr. 19, 2016 (JP) .............. JP2016-083780

(51) Int. Cl.
*B23B 27/14* (2006.01)
*C23C 14/06* (2006.01)

(52) U.S. Cl.
CPC ............ *B23B 27/148* (2013.01); *B23B 27/14* (2013.01); *C23C 14/06* (2013.01); *C23C 14/0617* (2013.01); *B23B 2222/88* (2013.01)

(58) Field of Classification Search
CPC ... B23B 27/14; B23B 27/148; C23C 14/0635; C23C 14/0641; C23C 14/0664; C23C 28/42
(Continued)

(56) References Cited

U.S. PATENT DOCUMENTS

2012/0282050 A1    11/2012    Setoyama et al.
2015/0152561 A1    6/2015    Kang et al.
(Continued)

FOREIGN PATENT DOCUMENTS

CN    107848040 A    3/2018
JP    2002-096205 A    4/2002
(Continued)

*Primary Examiner* — Archene A Turner
(74) *Attorney, Agent, or Firm* — Baker Botts L.L.P.; Michael A. Sartori

(57) ABSTRACT

A surface-coated cutting tool includes a substrate and a coating film. The coating film includes an alternate layer. The alternate layer includes a first layer having a first composition and a second layer having a second composition. The alternate layer is formed by alternately stacking at least one first layer and at least one second layer. The first layer and the second layer each have a thickness not smaller than 2 nm and not greater than 100 nm. The first composition is expressed as $Ti_aAl_bSi_cN$ ($0.25 \leq a \leq 0.45$, $0.55 \leq b \leq 0.75$, $0 \leq c \leq 0.1$, $a+b+c=1$). The second composition is expressed as $Ti_dAl_eSi_fN$ ($0.35 \leq d \leq 0.55$, $0.45 \leq e \leq 0.65$, $0 \leq f \leq 0.1$, $d+e+f=1$). The first composition and the second composition satisfy a condition of $0.05 \leq d-a \leq 0.2$ and $0.05 \leq b-e \leq 0.2$.

7 Claims, 4 Drawing Sheets

(58) Field of Classification Search
USPC .......... 51/307, 309; 428/216, 226, 697, 698, 428/699
See application file for complete search history.

(56) References Cited

U.S. PATENT DOCUMENTS

| | | |
|---|---|---|
| 2016/0175939 A1 | 6/2016 | Tanaka et al. |
| 2018/0099335 A1 | 4/2018 | Takeshita et al. |
| 2018/0236563 A1 | 8/2018 | Hirano et al. |
| 2018/0281078 A1* | 10/2018 | Hirano .................. C23C 14/325 |

FOREIGN PATENT DOCUMENTS

| | | |
|---|---|---|
| JP | 2009-061520 A | 3/2009 |
| JP | 2011-224715 A | 11/2011 |
| JP | 5771882 B2 | 9/2015 |
| WO | 2015/186503 A1 | 12/2015 |
| WO | 2017/022501 A1 | 2/2017 |

* cited by examiner

SURFACE-COATED CUTTING TOOL

TECHNICAL FIELD

The present disclosure relates to a surface-coated cutting tool.

The present application claims priority to Japanese Patent Application No. 2016-083780 filed on Apr. 19, 2016, the entire contents of which are hereby incorporated by reference.

BACKGROUND ART

Japanese Patent Laying-Open No. 2002-096205 (PTD 1) and Japanese Patent Laying-Open No. 2011-224715 (PTD 2) disclose a surface-coated cutting tool including a substrate and a coating film formed on a surface of the substrate.

CITATION LIST

Patent Document

PTD 1: Japanese Patent Laying-Open No. 2002-096205
PTD 2: Japanese Patent Laying-Open No. 2011-224715

SUMMARY OF INVENTION

A surface-coated cutting tool according to the present disclosure includes a substrate and a coating film formed on a surface of the substrate. The coating film includes an alternate layer. The alternate layer includes a first layer having a first composition and a second layer having a second composition. The alternate layer is formed by alternately stacking at least one first layer and at least one second layer. The first layer and the second layer each have a thickness not smaller than 2 nm and not greater than 100 nm.

The first composition is expressed as $Ti_aAl_bSi_cN$ ($0.25 \leq a \leq 0.45$, $0.55 \leq b \leq 0.75$, $0 \leq c \leq 0.1$, $a+b+c=1$). The second composition is expressed as $Ti_dAl_eSi_fN$ ($0.35 \leq d \leq 0.55$, $0.45 \leq e \leq 0.65$, $0 \leq f \leq 0.1$, $d+e+f=1$). The first composition and the second composition satisfy a condition of $0.05 \leq d-a \leq 0.2$ and $0.05 \leq b-e \leq 0.2$.

DETAILED DESCRIPTION

Figure 1:
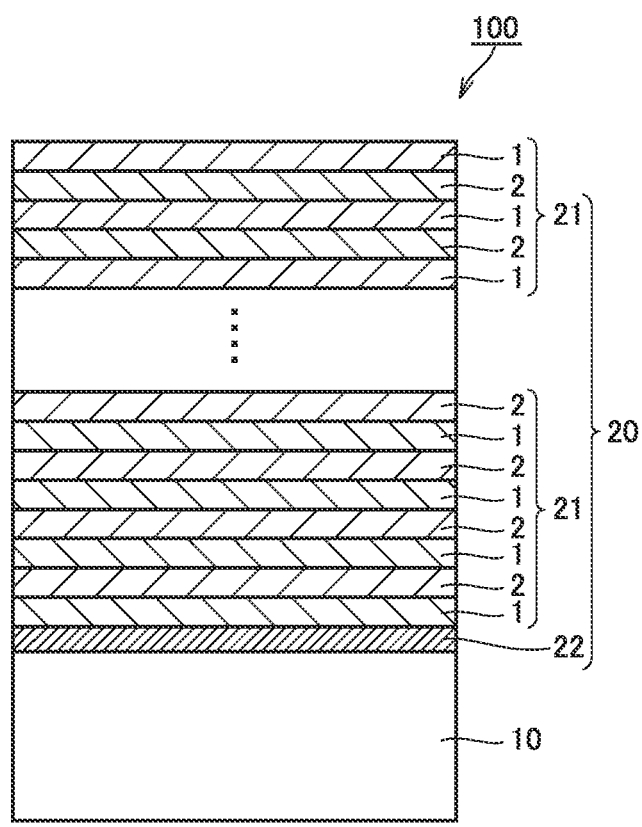
FIG. 1 is a schematic partial cross-sectional view showing one example of a construction of a surface-coated cutting tool according to an embodiment of the present disclosure.

[Problem to be Solved by the Present Disclosure]

Environments for surface-coated cutting tools change each day. In particular, in recent years, there are a wider variety of work materials with the emergence of new materials and a speed of working (a cutting speed and a feed rate) is noticeably high. Demands for the surface-coated cutting tools have thus increasingly become high.

For example, a nickel (Ni)-based heat-resistant alloy has been developed and put into industrial use. The Ni-based heat-resistant alloy is a new material excellent in heat resistance. In contrast, however, the Ni-based heat-resistant alloy is what is called a difficult-to-cut material, and a lifetime of a tool tends to be short in cutting thereof.

In cutting of a difficult-to-cut material such as the Ni-based heat-resistant alloy, increase in temperature at a cutting edge of the tool is noticeable. As a speed of working is higher, a temperature at the cutting edge of the tool further becomes higher. Therefore, development of a coating film exhibiting wear resistance and oxidation resistance even in a high-temperature environment has been demanded.

According to PTD 1, oxidation resistance is improved and deterioration of the coating film at a high temperature is suppressed by adding silicon (Si) to a TiAlN (titanium aluminum nitride) coating film. With the TiAlN coating film containing Si, however, a lifetime of the tool may become short due to adhesion fracture.

Adhesion fracture refers to fracture caused by adhesion of a work material to a cutting edge of a tool during cutting and consequent peel-off of the coating film. Adhesion fracture is likely, for example, when a material high in affinity with a material for a tool such as a Ni-based heat-resistant alloy is cut.

By adding Si to the TiAlN coating film, a hardness of the coating film is improved. Compressive stress, however, tends to remain in the coating film, and adhesiveness inside the coating film tends to lower. Adhesion fracture is thus considered to be likely. PTD 1 discloses also a construction in which a TiAlSiN layer and a TiAlN layer are stacked. When a TiAlN coating film containing Si is layered to form a multi-layered structure, however, adhesion fracture is considered to be more likely due to delamination.

PTD 2 has proposed a coating film formed by alternately stacking a thin layer A having a particulate crystal structure of TiAlN and a thin layer B formed of columnar crystals of TiAlN. According to PTD 2, thin layer A and thin layer B are identical to each other in composition, and hence peeling (delamination) between thin layer A and thin layer B can be suppressed. According to this construction, however, since adjacent unit layers (thin layer A and thin layer B) are identical to each other in composition, a crack tends to develop along a crystal grain boundary and propagate between the unit layers. A long crack can thus develop and may lead to fracture.

In view of the above, an object of the present disclosure is to provide a surface-coated cutting tool of which lifetime is improved.

DESCRIPTION OF EMBODIMENTS IN THE PRESENT DISCLOSURE

Embodiments of the present disclosure will initially be listed and described.

[1] A surface-coated cutting tool includes a substrate and a coating film formed on a surface of the substrate. The coating film includes an alternate layer. The alternate layer includes a first layer having a first composition and a second layer having a second composition. The alternate layer is formed by alternately stacking at least one first layer and at least one second layer. The first layer and the second layer each have a thickness not smaller than 2 nm and not greater than 100 nm.

The first composition is expressed as $Ti_aAl_bSi_cN$ ($0.25 \leq a \leq 0.45$, $0.55 \leq b \leq 0.75$, $0 \leq c \leq 0.1$, $a+b+c=1$). The second composition is expressed as $Ti_dAl_eSi_fN$ ($0.35 \leq d \leq 0.55$, $0.45 \leq e \leq 0.65$, $0 \leq f \leq 0.1$, $d+e+f=1$). The first composition and the second composition satisfy a condition of $0.05 \leq d-a \leq 0.2$ and $0.05 \leq b-e \leq 0.2$.

In the surface-coated cutting tool (which may be abbreviated as a "tool" below) in [1], the first layer and the second layer included in the alternate layer are each a TiAlN layer, and they are close to each other also in composition. Therefore, the alternate layer is macroscopically uniform in composition. The first layer and the second layer, however, are microscopically different in composition from each other.

Specifically, the first layer and the second layer are TiAlN layers close to each other in composition to such an extent that crystal lattices can be continuous therebetween, and at the same time, they are TiAlN layers different from each other in composition to such an extent that a crack does not propagate between the first layer and the second layer. Therefore, in the alternate layer, both of delamination and propagation of a crack between the first layer and the second layer can be suppressed.

The first layer and the second layer each have a thickness not smaller than 2 nm and not greater than 100 nm. When the first layer and the second layer each have a thickness smaller than 2 nm, the first layer and the second layer are mixed with each other, and an effect of suppression of propagation of a crack may be lowered. When the first layer and the second layer each have a thickness exceeding 100 nm, an effect of suppression of delamination may be lowered.

The first layer and the second layer are TiAlN layers higher in composition ratio of aluminum (Al) than titanium (Ti). It has been found that, even though the alternate layer formed by alternately stacking the first layer and the second layer as such substantially contains no Si, sufficient oxidation resistance is exhibited. It has also been found that, with the coating film including the alternate layer, even when compressive stress provided to the coating film is small, the coating film is high in hardness. Lowering in adhesiveness of the coating film can thus be suppressed while wear resistance is maintained.

[2] The first composition preferably satisfies a condition of $0<c \leq 0.05$.

[3] The second composition preferably satisfies a condition of $0<f \leq 0.05$.

As set forth above, even though the TiAlN layer higher in composition ratio of Al than Ti contains substantially no Si, sufficient oxidation resistance is exhibited. When the first layer and the second layer contain a trace amount of Si, however, further improvement in oxidation resistance can be expected while a hardness and adhesiveness of the coating film are maintained.

[4] The substrate preferably contains WC particles. The coating film preferably further includes an adhesive layer. The adhesive layer is interposed between the substrate and the alternate layer and is in contact with both of the substrate and the alternate layer. The adhesive layer has a thickness not smaller than 0.5 nm and not greater than 50 nm. The adhesive layer contains at least one compound selected from the group consisting of a metal carbide, a metal nitride, and a metal carbonitride. The compound contains (i) tungsten (W), (ii) at least one of Al and Si, and (iii) at least one selected from the group consisting of chromium (Cr), Ti, zirconium (Zr), and niobium (Nb).

By adopting a substrate containing WC particles, improvement in lifetime of the tool can be expected because tungsten carbide (WC) is high in hardness and excellent in wear resistance. With the coating film including the adhesive layer, peeling strength between the substrate and the coating film is improved. It is thus expected that adhesion fracture is suppressed and a lifetime of the tool is further improved.

The compound contained in the adhesive layer (a metal carbide, a metal nitride, and a metal carbonitride) contains W (a first element) and at least one of Al and Si (a second element). The first element is common to the element in WC particles contained in the substrate, and the second element is common to the element in the alternate layer (TiAlN). Therefore, such an adhesive layer is high in affinity with both of the substrate and the alternate layer and firmly adheres to both of the substrate and the alternate layer.

Furthermore, the compound contains at least one element (a third element) selected from the group consisting of Cr, Ti, Zr, and Nb. Though a detailed mechanism is not currently clear, a metal carbide, a metal nitride, and a metal carbonitride containing the third element in addition to the first element and the second element have been found to be very high in peeling strength. Therefore, the adhesive layer can exhibit sufficient peeling strength although it is a layer very small in thickness not smaller than 0.5 nm and not greater than 50 nm.

[5] The adhesive layer preferably contains carbon (C) and nitrogen (N). In a direction of thickness of the adhesive layer, a content of C preferably decreases from a first interface which is an interface between the substrate and the adhesive layer toward a second interface which is an interface between the adhesive layer and the alternate layer and is lowest at the second interface. A content of N preferably increases from the first interface toward the second interface and is highest at the second interface.

As set forth above, the alternate layer is composed of a nitride. When the substrate contains WC particles, the substrate is composed of a carbide. Therefore, with the adhesive layer containing both of C and N, the adhesive layer can have affinity with both of the substrate and the alternate layer.

As set forth above, a content of C and N is varied in the direction of thickness of the adhesive layer so that the adhesive layer has a composition closer to a carbide at the interface (the first interface) between the substrate and the adhesive layer, and the adhesive layer has a composition closer to a nitride at the interface (the second interface) between the adhesive layer and the alternate layer. Affinity between the adhesive layer and the substrate and affinity between the adhesive layer and the alternate layer are thus further enhanced. Namely, improvement in peeling strength can be expected.

[6] In a portion of the substrate in contact with the adhesive layer, the WC particles preferably occupy 80% or more of that portion.

When the substrate contains WC particles, normally, the substrate contains also a binder component (a binder phase) such as cobalt (Co). In forming an adhesive layer having the composition above, as an occupancy by the WC particles is higher in the portion of the substrate in contact with the adhesive layer, adhesiveness between the substrate and the coating film can be improved, because the adhesive layer is high in affinity with the WC particles among constituent components of the substrate.

[7] A surface-coated cutting tool includes a substrate and a coating film formed on a surface of the substrate. The coating film includes an alternate layer. The alternate layer includes a first layer having a first composition and a second layer having a second composition. The alternate layer is formed by alternately stacking at least one first layer and at least one second layer. The first layer and the second layer each have a thickness not smaller than 2 nm and not greater than 100 nm.

The first composition is expressed as $Ti_aAl_bSi_cN$ ($0.25 \le a \le 0.45$, $0.55 \le b \le 0.75$, $0 < c \le 0.05$, $a+b+c=1$). The second composition is expressed as $Ti_dAl_eSi_fN$ ($0.35 \le d \le 0.55$, $0.45 \le e \le 0.65$, $0 < f \le 0.05$, $d+e+f=1$). The first composition and the second composition satisfy a condition of $0.05 \le d-a \le 0.2$ and $0.05 \le b-e \le 0.2$.

Effects of the Present Disclosure

A surface-coated cutting tool of which lifetime is improved is provided.

Details of Embodiment of the Present Disclosure

An embodiment of the present disclosure (hereinafter also denoted as the "present embodiment") will be described below. The scope of the claims should not be limited to the description below.

<Surface-Coated Cutting Tool>

A shape and an application of a surface-coated cutting tool in the present embodiment are not particularly limited so long as the surface-coated cutting tool is a cutting tool. The surface-coated cutting tool in the present embodiment can be, for example, a drill, an end mill, a throwaway tip for milling, a throwaway tip for turning, a metal saw, a gear cutting tool, a reamer, a tap, or a tip for pin milling of a crankshaft.

FIG. 1 is a schematic partial cross-sectional view showing one example of a construction of a surface-coated cutting tool according to the embodiment of the present disclosure. A surface-coated cutting tool 100 includes a substrate 10 and a coating film 20 formed on a surface of substrate 10.

<<Substrate>>

Substrate 10 is not particularly limited. Substrate 10 can be composed, for example, of cemented carbide, cermet, ceramics, a cubic boron nitride sintered material, or a diamond sintered material. Substrate 10 is composed preferably of cemented carbide because cemented carbide is excellent in wear resistance.

Cemented carbide represents a sintered material mainly composed of WC particles. Cemented carbide contains a hard phase and a binder phase. The hard phase contains WC particles. The binder phase binds WC particles to each other. The binder phase contains, for example, Co. The binder phase may further contain, for example, titanium carbide (TiC), tantalum carbide (TaC), or niobium carbide (NbC).

When a compound is expressed herein with a composition formula without limiting a ratio of constituent elements such as "TiC", the composition formula encompasses all conventionally known compositions (element ratios). The composition here encompasses also a non-stoichiometric composition. For example, an expression "TiC" means not only a stoichiometric composition "$Ti_1C_1$" but also a non-stoichiometric composition such as "$Ti_1C_{0.8}$".

Cemented carbide may contain an impurity inevitably introduced during a process for manufacturing thereof. Furthermore, cemented carbide may contain free carbon or an abnormal layer called a "η layer" in its structure. A surface of cemented carbide may be reformed. For example, cemented carbide may include a beta (β) removal layer on the surface thereof.

Preferably, cemented carbide contains at least 87 mass % and at most 96 mass % of WC particles and contains at least 4 mass % and at most 13 mass % of Co. The WC particles have an average particle size preferably not smaller than 0.2 μm and not greater than 2 μm.

Co is softer than WC particles. As will be described later, ion bombardment treatment of a surface of substrate 10 can remove soft Co. Cemented carbide has the above-described composition and the WC particles have the above-described average particle size so that moderate projections and recesses are provided in the surface from which Co has been removed. It is considered that, by forming coating film 20 on such a surface, an anchor effect is expressed and adhesiveness between coating film 20 and substrate 10 is improved.

A size of WC particles refers to a diameter of a circle which circumscribes a two-dimensionally projected image of a WC particle. A particle size is measured with a scanning electron microscope (SEM) or a transmission electron microscope (TEM). Specifically, cemented carbide is cut, and a cut plane is observed with the SEM or the TEM. A diameter of the circle which circumscribes the WC particle in an observed image is regarded as a size of the WC particle. A size of ten or more (preferably fifty or more and more preferably one hundred or more) randomly extracted WC particles is measured in the observed image, and an arithmetic mean value thereof is regarded as an average size of the WC particles. In observation, the cut plane is desirably processed with cross section polisher (CP) or focused ion beam (FIB).

<<Coating Film>>

Coating film 20 is formed on a surface of substrate 10. Coating film 20 may be formed on a part or the entirety of the surface of substrate 10. Coating film 20 is formed in a portion of the surface of substrate 10 which corresponds at least to a cutting edge.

Coating film 20 includes an alternate layer 21. Coating film 20 may include other layers so long as it includes alternate layer 21. Coating film 20 may include an adhesive layer 22 which will be described later, for example, in a portion thereof in contact with substrate 10. Coating film 20 may include on its outermost surface, for example, a coloring layer for determining whether or not the cutting edge has been used. The coloring layer contains, for example, titanium nitride (TiN). A stacked structure of coating film 20 does not have to be uniform over the entire coating film 20 but may partially be different.

Coating film 20 has a thickness preferably not smaller than 0.5 μm and not greater than 15 μm. With coating film 20 having a thickness not smaller than 0.5 μm, a sufficient wear life can be expected. With coating film 20 having a thickness not greater than 15 μm, improvement in chipping resistance can be expected. Coating film 20 has a thickness more preferably not smaller than 0.5 μm and not greater than 10 μm and further preferably not smaller than 0.5 μm and not greater than 5 μm.

A thickness of coating film 20 and a thickness of each layer (for example, a first layer 1 and a second layer 2 which will be described later) included in coating film 20 are measured with the SEM or the TEM. Specifically, a tool is cut, and a thickness of coating film 20 and each layer is measured in a cross-section in a direction of thickness of the coating film. A thickness of coating film 20 is measured at least five locations therein, and an arithmetic mean value thereof is adopted as the thickness of coating film 20.

A crystal grain which forms coating film 20 in the present embodiment is desirably a cubic crystal. With the cubic crystal, a hardness tends to be high and a lifetime of the tool tends to be long. When coating film 20 partially contains amorphous crystal, a hardness of coating film 20 may lower.

<<Alternate Layer>>

Alternate layer 21 includes first layer 1 having a first composition and second layer 2 having a second composition. Alternate layer 21 is formed by alternately stacking at least one first layer 1 and at least one second layer 2.

So long as alternate layer 21 includes at least one first layer 1 and at least one second layer 2, the number of stacked layers is not particularly limited. The number of stacked layers means a total number of first layers 1 and second layers 2 included in alternate layer 21. The number of stacked layers is, for example, approximately not smaller than 5 and not greater than 7500, preferably approximately not smaller than 10 and not greater than 5000, and more preferably approximately not smaller than 20 and not greater than 500. In alternate layer 21, a layer closest to substrate 10 may be first layer 1 or second layer 2. In alternate layer 21, a layer most distant from substrate 10 may be first layer 1 or second layer 2.

First layer 1 and second layer 2 each have a thickness not smaller than 2 nm and not greater than 100 nm. It is considered that propagation and development of a crack can be suppressed by alternately repeating such thin layers. When a thickness of each of first layer 1 and second layer 2 is smaller than 2 nm, first layer 1 and second layer 2 are mixed with each other, and an effect of suppression of propagation of a crack may be lowered. When a thickness of first layer 1 and second layer 2 exceeds 100 nm, an effect of suppression of delamination may be lowered.

In measurement of a thickness of first layer 1 and second layer 2, a magnification for observation with the TEM is set, for example, to approximately 1000000×. The magnification for observation is adjusted as appropriate in accordance with a thickness of first layer 1 and second layer 2. A thickness of first layer 1 or second layer 2 is measured at at least five locations therein, and an arithmetic mean value thereof is adopted as the thickness of first layer 1 or second layer 2.

First layer 1 and second layer 2 each have a thickness preferably not smaller than 2 nm and not greater than 80 nm, more preferably not smaller than 2 nm and not greater than 50 nm, further preferably not smaller than 2 nm and not greater than 30 nm, and most preferably not smaller than 2 nm and not greater than 20 nm. By thus adjusting a thickness of first layer 1 and second layer 2, improvement in effect of suppression of propagation of a crack and effect of suppression of delamination can be expected.

(First Composition and Second Composition)

First layer 1 has a first composition. The first composition is expressed as $Ti_aAl_bSi_cN$ ($0.25 \leq a \leq 0.45$, $0.55 \leq b \leq 0.75$, $0 \leq c \leq 0.1$, $a+b+c=1$).

Second layer 2 has a second composition. The second composition is expressed as $Ti_dAl_eSi_fN$ ($0.35 \leq d \leq 0.55$, $0.45 \leq e \leq 0.65$, $0 \leq f \leq 0.1$, $d+e+f=1$).

The first composition and the second composition satisfy a condition of $0.05 \leq d-a \leq 0.2$ and $0.05 \leq b-e \leq 0.2$. With the condition of $0.05 \leq d-a$ and $0.05 \leq b-e$ being satisfied, the first composition and the second composition can be different from each other to such an extent that propagation of a crack between first layer 1 and second layer 2 can be suppressed. At the same time, with the condition of $d-a \leq 0.2$ and $b-e \leq 0.2$ being satisfied, the first composition and the second composition can be close to each other to such an extent that delamination between first layer 1 and second layer 2 can be suppressed. The first composition and the second composition satisfy preferably a condition of $0.05 \leq d-a \leq 0.1$ and $0.05 \leq b-e \leq 0.1$. The effect of suppression of propagation of a crack and delamination is thus considered to further improve.

In the first composition, "a" may satisfy a condition of $0.30 \leq a \leq 0.40$ or $0.35 \leq a \leq 0.40$. "b" may satisfy a condition of $0.60 \leq b \leq 0.70$ or $0.60 \leq b \leq 0.65$.

In the second composition, "d" may satisfy a condition of $0.40 \leq d \leq 0.50$ or $0.40 \leq d \leq 0.45$. "e" may satisfy a condition of $0.50 \leq e \leq 0.65$ or $0.50 \leq e \leq 0.55$.

First layer 1 and second layer 2 may each be a layer containing substantially no Si. In the first composition, "c" may be set to zero, and in the second composition, "f" may be set to zero. Preferably, a condition of $0 < c \leq 0.05$ (more preferably $0.01 \leq c \leq 0.05$) is satisfied and a condition of $0 < f \leq 0.05$ (more preferably $0.01 \leq f \leq 0.05$) is satisfied.

The first composition and the second composition (that is, a, b, c, d, e, and f) are determined with energy dispersive X-ray spectrometry (EDX). TEM-EDX is used for analysis of the composition. Specifically, five locations randomly extracted from first layer 1 or second layer 2 are subjected to EDX analysis while a cross-section in a direction of thickness of alternate layer 21 is observed with the TEM. A diameter of a measurement spot is set to 1 nm. Each of a, b, c, d, e, and f is found by calculating an arithmetic mean of a composition ratio of each element obtained from measurement at five locations.

When the number of stacked layers in alternate layer 21 is smaller than three, one layer in first layer 1 and one layer in second layer 2 are subjected to composition analysis to determine the first composition and the second composition. When the number of stacked layers is approximately from three to ten, two layers in first layer 1 and two layers in second layer 2 are subjected to composition analysis and the average composition of the two layers is adopted as the first composition or the second composition. When the number of stacked layers is approximately from ten to fifty, five layers in first layer 1 and five layers in second layer 2 are subjected to composition analysis and the average composition of the five layers is adopted as the first composition or the second composition. When the number of stacked layers exceeds fifty, ten layers in first layer 1 and ten layers in second layer 2 are subjected to composition analysis and the average composition of the ten layers is adopted as the first composition or the second composition.

<<Adhesive Layer>>

Coating film 20 preferably further includes adhesive layer 22. Adhesive layer 22 is interposed between substrate 10 and alternate layer 21. Adhesive layer 22 is in contact with both of substrate 10 and alternate layer 21. In the presence of adhesive layer 22 between substrate 10 and alternate layer 21, improvement in effect of suppression of adhesion fracture can be expected.

(Composition of Adhesive Layer)

Adhesive layer 22 contains at least one compound selected from the group consisting of a metal carbide, a metal nitride, and a metal carbonitride. Such a compound contains a first element, a second element, and a third element. W is adopted as the first element. The first element is an element common to an element in WC particles contained in substrate 10. At least one of Al and Si is adopted as the second element. The second element is an element common to an element in alternate layer 21 (TiAlN). The third element is at least one selected from the group consisting of Cr, Ti, Zr, and Nb.

Specific examples of the metal carbide, the metal nitride, and the metal carbonitride containing the first element, the second element, and the third element include WTiC, WTiN, WTiCN; WCrC, WCrN, WCrCN; WCrTiC, WCrTiN, WCrTiCN; WTiAlC, WTiAlN, WTiAlCN; WTiSiC, WTiSiN, WTiSiCN; WCrTiAlC, WCrTiAlN, WCrTiAlCN; WCr- TiSiC, WCrTiSiN, WCrTiSiCN; WTiAlSiC, WTiAlSiN, WTiAlSiCN; WCrTiAlSiC, WCrTiAlSiN, WCrTiAlSiCN; and the aforementioned compound in which the entirety or a part of Cr is substituted with at least one of Zr and Nb.

Adhesive layer 22 may contain one compound among them alone, or may contain two or more compounds. When adhesive layer 22 contains two or more compounds, the compounds may be in a form of a solid solution. Alternatively, two or more compounds may be present as being stratified in adhesive layer 22.

Adhesive layer 22 has a thickness preferably not smaller than 0.5 nm and not greater than 50 nm. Adhesive layer 22 composed as above can exhibit sufficient peeling strength so long as it has a thickness not smaller than 0.5 nm. So long as adhesive layer 22 has a thickness not smaller than 0.5 nm, improvement in peeling strength can be expected as the thickness is smaller. It is considered that residual stress is smaller with decrease in thickness. Therefore, adhesive layer 22 has a thickness more preferably not smaller than 0.5 nm and not greater than 40 nm, further preferably not smaller than 0.5 nm and not greater than 20 nm, and most preferably not smaller than 0.5 nm and not greater than 5 nm. A method of measuring a thickness of adhesive layer 22 is in conformity with the method of measuring a thickness of first layer 1 and second layer 2 described previously.

(Composition Variation of C and N)

Adhesive layer 22 preferably contains C and N. Namely, preferably, adhesive layer 22 contains a metal carbide and a metal nitride, contains a metal carbide and a metal carbonitride, contains a metal nitride and a metal carbonitride, or contains a metal carbonitride.

When adhesive layer 22 contains C and N, a content of C and N may be varied in a direction of thickness of adhesive layer 22. Adhesiveness between substrate 10 and coating film 20 is thus considered to improve, because affinity between adhesive layer 22 and substrate 10 and affinity between adhesive layer 22 and alternate layer 21 are enhanced. The content may be varied in the direction of thickness of adhesive layer 22 stepwise or in a ramped manner.

In this embodiment, a content of C preferably decreases from a first interface which is an interface between substrate 10 and adhesive layer 22 toward a second interface which is an interface between adhesive layer 22 and alternate layer 21 and is lowest at the second interface. Affinity between substrate 10 containing C and adhesive layer 22 is thus considered to improve.

A content of N preferably increases from the first interface toward the second interface and is highest at the second interface. Affinity between alternate layer 21 containing N and adhesive layer 22 is thus considered to improve.

Such variation in composition can be realized, for example, by varying a ratio of a flow rate between C source material gas and N source material gas in a process of forming adhesive layer 22 through vapor deposition.

Composition variation of C and N is checked with TEM-EDX. In a cross-section in the direction of thickness of adhesive layer 22, a mapping image of C and N is obtained in EDX analysis, and variation in composition is checked in the mapping image.

(Occupancy by WC Particles)

Adhesiveness between substrate 10 and coating film 20 can also be improved by making an occupancy by WC particles higher in a portion of substrate 10 in contact with adhesive layer 22, because adhesive layer 22 is high in affinity with WC particles among constituent components of substrate 10.

An occupancy by WC particles can be made relatively higher, for example, by reducing a binder phase (Co or the like) exposed at the surface of substrate 10. For example, the binder phase can be reduced by subjecting a surface of substrate 10 to ion bombardment treatment which will be described later.

An occupancy by WC particles in the portion of substrate 10 in contact with adhesive layer 22 is measured as below. Initially, a tool is cut along the direction of thickness of coating film 20 and a cross-section of the interface (first interface) between substrate 10 and adhesive layer 22 is obtained. The cross-section is processed as appropriate with FIB. The cross-section is observed with the TEM. In the observed image, a reference line having a length of 3 μm is set along the first interface. A total length of the portion where WC particles and adhesive layer 22 are in contact with each other within the reference line is measured. A percentage of a value calculated by dividing the total length by the length of the reference line represents the occupancy by the WC particles.

The occupancy by WC particles is preferably not lower than 80%. A higher occupancy by the WC particles is desirable. The upper limit of the occupancy may be 100%. The occupancy by the WC particles is more preferably not lower than 85%, further preferably not lower than 90%, and most preferably not lower than 95%.

<Method of Manufacturing Surface-Coated Cutting Tool>

The surface-coated cutting tool in the present embodiment described above can be manufactured with a manufacturing method below.

Figure 2:
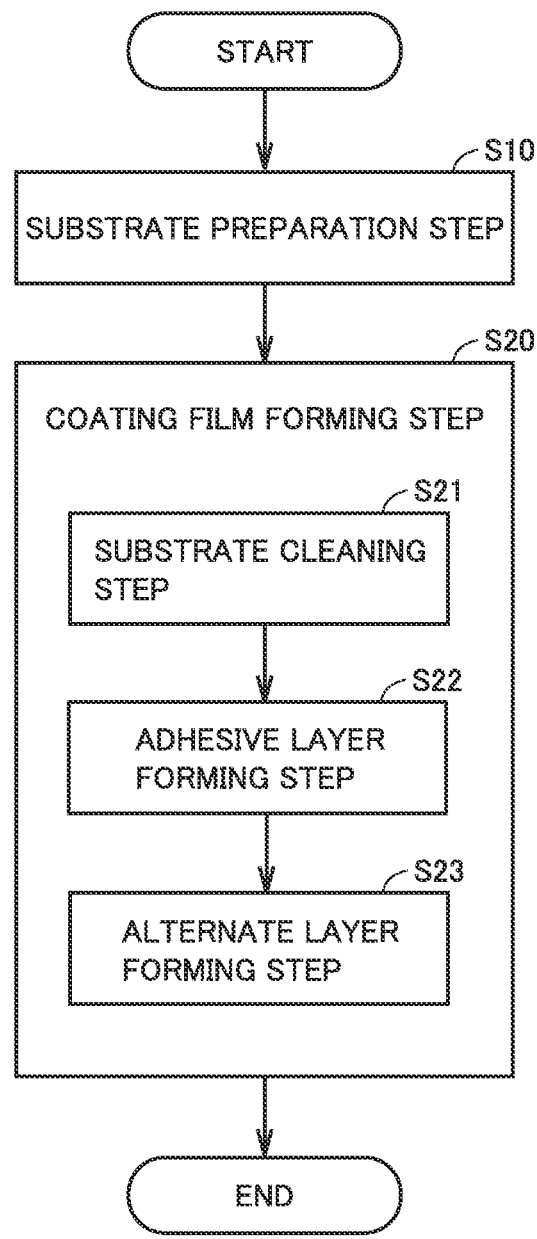
FIG. 2 is a flowchart showing overview of a method of manufacturing a surface-coated cutting tool according to the embodiment of the present disclosure.

FIG. 2 is a flowchart showing overview of a method of manufacturing a surface-coated cutting tool according to the embodiment of the present disclosure. The manufacturing method includes a substrate preparation step (S10) and a coating film forming step (S20). The coating film forming step (S20) includes at least an alternate layer forming step (S23). The coating film forming step (S20) can further include a substrate cleaning step (S21) and an adhesive layer forming step (S22).

<<Substrate Preparation Step (S10)>>

In the substrate preparation step (S10), substrate 10 is prepared. For example, cemented carbide in a prescribed shape is prepared as substrate 10. Cemented carbide can be prepared with general powder metallurgy. One example of a specific procedure is shown below.

Mixed powders are obtained by mixing WC particles and Co powders with a wet method with the use of a ball mill. For example, ethanol is adopted as a solvent. The mixed powders are dried. A compact is obtained by shaping the dried mixed powders into a prescribed shape. A sintered material (cemented carbide) is obtained by sintering the compact. The sintered material is subjected to prescribed cutting edge working (for example, honing). Substrate 10 made of cemented carbide is prepared as set forth above.

<<Coating Film Forming Step (S20)>>

In the coating film forming step (S20), coating film 20 is formed on a surface of substrate 10.

In the present embodiment, coating film 20 is formed preferably with physical vapor deposition (PVD). Coating film 20 may be formed with chemical vapor deposition (CVD). Coating film 20 formed with PVD tends to be less in deterioration at a high temperature. This may be because a highly crystalline compound tends to be generated with PVD as compared with CVD.

Specific examples of PVD include arc ion plating (ATP), balanced magnetron sputtering (BMS), and unbalanced magnetron sputtering (UBMS).

In AIP, arc discharge is caused with a target material being set as a cathode. The target material is thus vaporized and ionized. Then, ions are deposited on a surface of substrate 10 to which a negative bias voltage is applied.

In BMS, a target material is arranged on a magnetron electrode and gas plasma is generated by using magnetic field of the magnetron electrode. The target material is thus vaporized and ionized. Ions are then deposited on a surface of substrate 10. UBMS is a method of increasing a frequency of collision of ions against substrate 10 by intentionally disrupting balance of magnetic field in BMS.

AIP is excellent in ratio of ionization of a target material. By adopting AIP here, the substrate cleaning step (S21) to the alternate layer forming step (S23) can be performed in the same film formation apparatus, which is cost efficient.

(Substrate Cleaning Step (S21))

In the substrate cleaning step (S21), a surface of substrate 10 is cleaned.

For example, the surface of substrate 10 can be cleaned by subjecting the surface of substrate 10 to first ion bombardment treatment with argon (Ar) ions. The binder phase exposed at the surface of substrate 10 can thus be reduced. An occupancy by WC particles can be increased at the interface (first interface) between adhesive layer 22 which will be formed later and substrate 10.

Since second ion bombardment treatment which will be described later can also be expected to have a cleaning function, an embodiment in which first ion bombardment treatment is not performed depending on a condition is also possible.

After first ion bombardment treatment, the surface of substrate 10 may further be subjected to second ion bombardment treatment with one or more metals selected from the group consisting of Cr, Ti, Zr, and Nb being adopted as a target material. Thus, the binder phase exposed at the surface of substrate 10 can further be reduced. The third element (Cr, Ti, Zr, and Nb) of adhesive layer 22 can be attached in advance to the surface of substrate 10. A thickness of adhesive layer 22 can be adjusted, for example, based on an amount of attached third element here.

Preferably, Cr is adopted as the target material in second ion bombardment treatment. Cr is a metal which can sublimate. Therefore, Cr is less likely to become molten particles (droplets) during ion bombardment treatment. Therefore, by adopting Cr, roughening of the surface of substrate 10 brought about by ion bombardment treatment can be suppressed.

(Adhesive Layer Forming Step (S22))

In the adhesive layer forming step (S22), adhesive layer 22 in contact with substrate 10 is formed. For example, the second element (Al, Si), Ti, and N are further deposited with AIP on the surface of substrate 10 to which the third element has been attached by second ion bombardment treatment.

A deposition in which the third element and the second element are fused is thus generated. Furthermore, the first element (W) and C are diffused from WC particles into the deposition. Consequently, a metal carbide, a metal nitride, or a metal carbonitride containing the first element, the second element, and the third element is generated and adhesive layer 22 is formed.

(Alternate Layer Forming Step (S23))

In the alternate layer forming step (S23), alternate layer 21 is formed on the surface of substrate 10 or the surface of adhesive layer 22. By forming alternate layer 21 on the surface of adhesive layer 22, adhesive layer 22 is interposed between substrate 10 and alternate layer 21 and is in contact with both of substrate 10 and alternate layer 21.

Alternate layer 21 is formed by alternately stacking at least one first layer 1 and at least one second layer 2. Alternate layer 21 can be formed, for example, with a method as below.

(A) In AIP, a sintered alloy which contains Ti, Al, and Si and is different in particle size among the metals is employed as the target material.

(B) In AIP, a plurality of target materials (sintered alloys) different in composition are employed.

(C) In AIP, during film formation, a bias voltage applied to substrate 10 is varied like pulses.

(D) In AIP, a flow rate of gas is varied.

(E) In AIP, substrate 10 is turned and a period of turning is controlled.

Each of methods (A) to (E) alone can allow formation of alternate layer 21. Combination of methods (A) to (E) can also allow formation of alternate layer 21.

Surface-coated cutting tool 100 including substrate 10 and coating film 20 formed on a surface of substrate 10 can be manufactured as set forth above.

EXAMPLES

Examples will be described below. The scope of claims should not be limited to the examples below.

<Manufacturing of Surface-Coated Cutting Tool>

Various surface-coated cutting tools were manufactured and a lifetime of the tools was evaluated as below.

<<Sample No. 1>>

1. Substrate Preparation Step (S10)

Substrate 10 below was prepared. Substrate 10 contained WC particles (90 mass %) and Co (10 mass %). The WC particles had an average particle size of 2 μm. The average particle size of the WC particles was measured with the method described previously.

(Specifications of Substrate)

Tip model No.: SFKN12T3AZTN (manufactured by Sumitomo Electric Hardmetal Corporation)

Material: cemented carbide (ISO P30 grade)

2. Coating Film Forming Step (S20)

Figure 3:
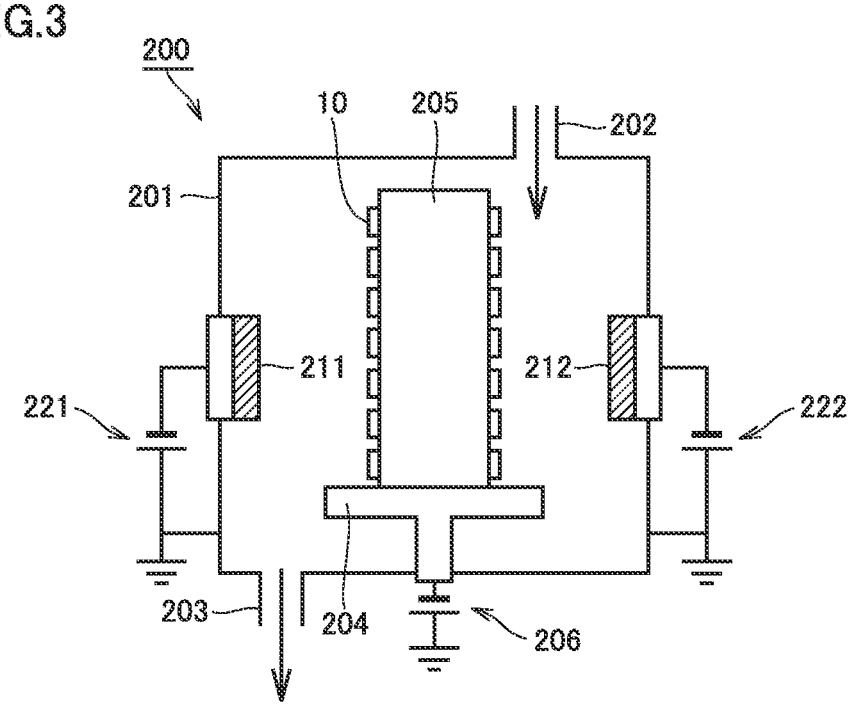
FIG. 3 is a schematic cross-sectional view of a film formation apparatus.
Figure 4:
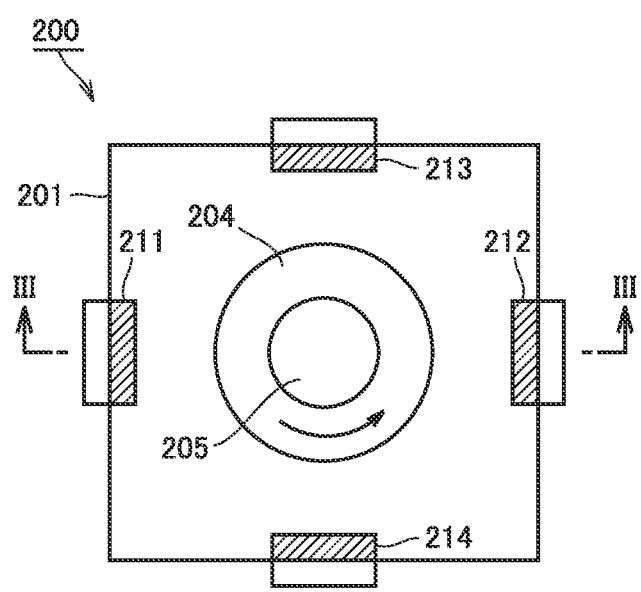
FIG. 4 is a schematic plan view of the film formation apparatus.

FIG. 3 is a schematic cross-sectional view of a film formation apparatus. FIG. 4 is a schematic plan view of the film formation apparatus. FIG. 3 shows a cross-section along the line III-III in FIG. 4. A film formation apparatus 200 shown in FIGS. 3 and 4 is an AIP apparatus. In the present example, a coating film was formed by using film formation apparatus 200. A construction of film formation apparatus 200 will initially be described.

As shown in FIG. 3, film formation apparatus 200 includes a chamber 201. Chamber 201 is provided with a gas introduction port 202 for introducing source gas into chamber 201 and a gas emission port 203 for emitting the source gas from chamber 201 to the outside. Gas emission port 203 is connected to a not-shown vacuum pump. A pressure in chamber 201 is regulated based on an amount of introduction and emission of gas.

In chamber 201, a turntable 204 is arranged. A substrate holder 205 for holding substrate 10 is attached to turntable 204. Substrate holder 205 is connected to a negative electrode of a bias power supply 206. A positive electrode of bias power supply 206 is grounded.

As shown in FIG. 4, a plurality of target materials 211, 212, 213, and 214 are attached to a sidewall of chamber 201. As shown in FIG. 3, target materials 211 and 212 are connected to negative electrodes of direct-current (DC) power supplies 221 and 222, respectively. DC power supplies 221 and 222 are variable power supplies and positive electrodes thereof are grounded. This is also the case with target materials 213 and 214, although they are not shown in FIG. 3. Specific operations will be described below.

2-1. Substrate Cleaning Step (S21)

Substrate 10 was held on substrate holder 205. A pressure in chamber 201 was regulated to $1.0 \times 10^{-4}$ Pa with the vacuum pump. While turntable 204 was turned, a temperature of substrate 10 was adjusted to 500° C. with a heater (not shown) attached to film formation apparatus 200.

Ar gas was introduced through gas introduction port 202 and a pressure in chamber 201 was regulated to 3.0 Pa. While the pressure was maintained, a voltage of bias power supply 206 was gradually varied and finally adjusted to −1000 V. Then, the surface of substrate 10 was cleaned through first ion bombardment treatment using Ar ions.

2-2. Alternate Layer Forming Step (S23)

A sintered alloy with which alternate layer 21 having a composition shown in Table 1 below could be formed was prepared as each of target materials 211, 212, 213, and 214. Target materials 211, 212, 213, and 214 were set at prescribed positions. Nitrogen gas was introduced through gas introduction port 202 and alternate layer 21 was formed while turntable 204 was turned. A condition for forming alternate layer 21 is as shown below.

(Condition for Forming Alternate Layer)
Temperature of substrate: 500° C.
Reaction gas pressure: 0.5 to 10 Pa
Bias voltage: −30 V to −800 V
Arc current: 100 A A reaction gas pressure and a bias voltage were set to constant values within the ranges above or continuously varied in value within the ranges above.

A surface-coated cutting tool according to sample No. 1 was manufactured as set forth above. Table 1 below shows a construction of the coating film. A composition and a thickness of each layer shown in Table 1 below were measured with the method described previously.

<<Samples Nos. 2 and 3>>

Surface-coated cutting tools according to samples Nos. 2 and 3 were manufactured similarly to sample No. 1 except for change in thickness of first layer 1, thickness of second layer 2, and the number of stacked layers as shown in Table 1 below.

<<Samples Nos. 4 to 7>>

Surface-coated cutting tools according to samples Nos. 4 to 7 were manufactured similarly to sample No. 3 except for change in composition of a target material (sintered alloy) such that alternate layers each having a composition shown in Table 1 below were formed.

<<Sample No. 8>>

For sample No. 8, in the substrate cleaning step (S21), after first ion bombardment treatment with Ar ions, second ion bombardment treatment with Cr ions was further performed. Alternate layer 21 was formed on a surface subjected to such treatment. Namely, for sample No. 8, the adhesive layer forming step (S22) was performed. A surface-coated cutting tool according to sample No. 8 was manufactured similarly to sample No. 1 except for this aspect. Table 2 below shows a composition and a thickness of adhesive layer 22 in sample No. 8. Table 2 below shows an occupancy by WC particles in a portion where substrate 10 and adhesive layer 22 were in contact with each other. These values were measured with the method described previously.

<<Samples Nos. 9 to 13>>

Surface-coated cutting tools according to samples Nos. 9 to 13 were manufactured similarly to sample No. 8 except for change in composition of the target material (sintered alloy) such that alternate layers 21 each having a composition shown in Table 1 below and adhesive layer 22 were formed and change in condition for second ion bombardment treatment.

<<Samples Nos. 14 to 17>>

For samples Nos. 14 to 17, adhesive layer 22 was not formed but a TiAlN-based coating film having a single composition shown in Table 1 below was formed. Surface-coated cutting tools according to samples Nos. 14 to 17 were manufactured similarly to samples Nos. 1 to 7 except for these aspects. In Table 1 below, compositions of the coating films of samples Nos. 14 to 17 are shown in the field of the first layer for the sake of convenience.

TABLE 1

List of Alternate Layer

| | Coating Film Alternate Layer | | | | | | | | | | |
|---|---|---|---|---|---|---|---|---|---|---|---|
| | First Layer First Composition $Ti_aAl_bSi_cN$ | | | Second Layer Second Composition $Ti_dAl_eSi_fN$ | | | | | Thickness of First Layer | Thickness of Second Layer | The Number of Stacked Layers | Total Thickness |
| No. | a | b | c | d | e | f | d − a | b − c | [nm] | [nm] | [—] | [μm] |
| 1 | 0.40 | 0.60 | 0 | 0.45 | 0.55 | 0 | 0.05 | 0.05 | 1 | 1 | 3000 | 3 |
| 2 | 0.40 | 0.60 | 0 | 0.45 | 0.55 | 0 | 0.05 | 0.05 | 200 | 200 | 15 | 3 |
| 3 | 0.40 | 0.60 | 0 | 0.45 | 0.55 | 0 | 0.05 | 0.05 | 10 | 10 | 300 | 3 |
| 4 | 0.35 | 0.65 | 0 | 0.55 | 0.45 | 0 | 0.20 | 0.20 | 10 | 10 | 300 | 3 |
| 5 | 0.40 | 0.60 | 0 | 0.50 | 0.50 | 0 | 0.10 | 0.10 | 10 | 10 | 300 | 3 |
| 6 | 0.30 | 0.60 | 0.10 | 0.35 | 0.55 | 0.10 | 0.05 | 0.05 | 10 | 10 | 300 | 3 |
| 7 | 0.39 | 0.60 | 0.01 | 0.44 | 0.55 | 0.01 | 0.05 | 0.05 | 10 | 10 | 300 | 3 |
| 8 | 0.40 | 0.60 | 0 | 0.45 | 0.55 | 0 | 0.05 | 0.05 | 10 | 10 | 300 | 3 |
| 9 | 0.25 | 0.74 | 0.01 | 0.35 | 0.60 | 0.05 | 0.10 | 0.14 | 10 | 10 | 300 | 3 |
| 10 | 0.39 | 0.60 | 0.01 | 0.44 | 0.55 | 0.01 | 0.05 | 0.05 | 10 | 10 | 300 | 3 |
| 11 | 0.40 | 0.60 | 0 | 0.45 | 0.55 | 0 | 0.05 | 0.05 | 10 | 10 | 300 | 3 |
| 12 | 0.40 | 0.60 | 0 | 0.50 | 0.50 | 0 | 0.10 | 0.10 | 10 | 10 | 300 | 3 |
| 13 | 0.39 | 0.60 | 0.01 | 0.44 | 0.55 | 0.01 | 0.05 | 0.05 | 10 | 10 | 300 | 3 |
| 14 | 1.00 | 0 | 0 | — | — | — | — | — | — | — | — | 3 |

TABLE 1-continued

List of Alternate Layer

| | Coating Film Alternate Layer | | | | | | | | | | |
|---|---|---|---|---|---|---|---|---|---|---|---|
| | First Layer First Composition Ti$_a$Al$_b$Si$_c$N | | | Second Layer Second Composition Ti$_d$Al$_e$Si$_f$N | | | | | Thickness of First Layer [nm] | Thickness of Second Layer [nm] | The Number of Stacked Layers [—] | Total Thickness [μm] |
| No. | a | b | c | d | e | f | d − a | b − e | | | | |
| 15 | 0.40 | 0.60 | 0 | — | — | — | — | — | — | — | — | 3 |
| 16 | 0.35 | 0.65 | 0 | — | — | — | — | — | — | — | — | 3 |
| 17 | 0.39 | 0.60 | 0.01 | — | — | — | — | — | — | — | — | 3 |

TABLE 2

List of Substrate, Adhesive Layer, and Results of Evaluation

| | Substrate Occupancy by WC | Coating Film Adhesive Layer | | | Lifetime of Tool Cutting |
|---|---|---|---|---|---|
| No. | Particles [%] | Composition | Variation in Content of C, N | Thickness [nm] | Distance [m] |
| 1 | — | — | — | — | 600 |
| 2 | — | — | — | — | 600 |
| 3 | — | — | — | — | 800 |
| 4 | — | — | — | — | 700 |
| 5 | — | — | — | — | 800 |
| 6 | — | — | — | — | 700 |
| 7 | — | — | — | — | 900 |
| 8 | 90 | W$_{0.40}$Cr$_{0.25}$Ti$_{0.15}$Al$_{0.20}$CN | Yes | 40 | 1000 |
| 9 | 90 | W$_{0.40}$Cr$_{0.25}$Ti$_{0.10}$Al$_{0.20}$Si$_{0.05}$CN | Yes | 40 | 1100 |
| 10 | 90 | W$_{0.40}$Cr$_{0.25}$Ti$_{0.09}$Al$_{0.20}$Si$_{0.01}$CN | Yes | 40 | 1200 |
| 11 | 90 | W$_{0.40}$Cr$_{0.25}$Ti$_{0.15}$Al$_{0.20}$CN | Yes | 5 | 1200 |
| 12 | 90 | W$_{0.40}$Cr$_{0.25}$Ti$_{0.15}$Al$_{0.20}$CN | Yes | 5 | 1300 |
| 13 | 90 | W$_{0.40}$Cr$_{0.25}$Ti$_{0.09}$Al$_{0.20}$Si$_{0.01}$CN | Yes | 5 | 1400 |
| 14 | — | — | — | — | 300 |
| 15 | — | — | — | — | 500 |
| 16 | — | — | — | — | 400 |
| 17 | — | — | — | — | 600 |

<Evaluation>

A lifetime of the tool of each sample was evaluated in a cutting test. Specifically, wet intermittent cutting was performed under cutting conditions below and a cutting distance until the tool was chipped was measured. Table 2 above shows results. A longer cutting distance in Table 2 indicates a longer lifetime of the tool.

(Cutting Conditions)
Work material: Ni-based heat-resistant alloy
Cutting speed: 40 m/min.
Feed rate: 0.1 mm/blade
Depth of cut ap: 1.0 mm
Depth of cut ae: 50 mm As shown in Table 2, samples Nos. 3 to 13 achieved an improved lifetime of the tool as compared with other samples.

As shown in Table 1, in samples Nos. 14 to 17, the coating films each had a single composition. Therefore, it is considered that a crack propagated along a grain boundary and the lifetime of the tool was not long.

In samples Nos. 3 to 13, coating film 20 included alternate layer 21. In samples Nos. 3 to 13, first layer 1 and second layer 2 included in alternate layer 21 were considered as being close to each other in composition to such an extent that delamination could be suppressed and as being different from each other in composition to such an extent that propagation of a crack could be suppressed.

Nos. 1 and 2 were shorter in lifetime of the tool than Nos. 3 to 13, although coating film 20 included alternate layer 21 in Nos. 1 and 2. No. 1 is considered as being lower in effect of suppression of propagation of a crack because of too small a thickness of first layer 1 and second layer 2 and resultant mixing between first layer 1 and second layer 2. No. 2 is considered as being too large in thickness of first layer 1 and second layer 2, which resulted in tendency of delamination between first layer 1 and second layer 2.

As shown in Table 2, samples Nos. 8 to 13 were longer in lifetime of the tool than samples Nos. 3 to 7. Adhesiveness between substrate 10 and coating film 20 is considered to have improved owing to coating film 20 including adhesive layer 22.

The embodiment and the examples disclosed herein are illustrative and non-restrictive in every respect. The technical scope defined by the terms of the claims is intended to include any modifications within the scope and meaning equivalent to the terms of the claims.

REFERENCE SIGNS LIST

1 first layer; 2 second layer; 10 substrate; 20 coating film; 21 alternate layer; 22 adhesive layer; 100 surface-coated cutting tool; 200 film formation apparatus; 201 chamber; 202 gas introduction port; 203 gas emission port; 204 turntable; 205 substrate holder; 206 bias power supply; 211, 212, 213, 214 target material; and 221, 222 DC power supply

The invention claimed is:

1. A surface-coated cutting tool comprising:
a substrate; and
a coating film formed on a surface of the substrate,
the coating film including an alternate layer,
the alternate layer including a first layer having a first composition and a second layer having a second composition,
the alternate layer being formed by alternately stacking at least one first layer and at least one second layer,
the first layer and the second layer each having a thickness not smaller than 2 nm and not greater than 100 nm,
the first composition being expressed as $Ti_aAl_bSi_cN$ ($0.25 \leq a \leq 0.45$, $0.55 \leq b \leq 0.75$, $0.01 \leq c \leq 0.05$, $a+b+c=1$),
the second composition being expressed as $Ti_dAl_eSi_fN$ ($0.35 \leq d \leq 0.55$, $0.45 \leq e \leq 0.65$, $0.01 \leq f \leq 0.05$, $d+e+f=1$), and
the first composition and the second composition satisfying a condition of $0.05 \leq d-a \leq 0.2$ and $0.05 \leq b-e \leq 0.2$.

2. The surface-coated cutting tool according to claim 1, wherein
the substrate contains WC particles,
the coating film further includes an adhesive layer,
the adhesive layer is interposed between the substrate and the alternate layer and is in contact with both of the substrate and the alternate layer,
the adhesive layer has a thickness not smaller than 0.5 nm and not greater than 50 nm,
the adhesive layer contains at least one compound selected from the group consisting of a metal carbide, a metal nitride, and a metal carbonitride, and
the compound contains
W,
at least one of Al and Si, and
at least one selected from the group consisting of Cr, Ti, Zr, and Nb.

3. The surface-coated cutting tool according to claim 2, wherein
the adhesive layer contains carbon and nitrogen,
in a direction of thickness of the adhesive layer, a content of the carbon decreases from a first interface which is an interface between the substrate and the adhesive layer toward a second interface which is an interface between the adhesive layer and the alternate layer, and is lowest at the second interface, and a content of the nitrogen increases from the first interface toward the second interface and is highest at the second interface.

4. The surface-coated cutting tool according to claim 2, wherein
in a portion of the substrate in contact with the adhesive layer, the WC particles occupy 80% or more of that portion.

5. The surface-coated cutting tool according to claim 1, wherein
a total number of the first layer and the second layer included in the alternate layer is not smaller than 20 and not greater than 500.

6. A surface-coated cutting tool comprising:
a substrate; and
a coating film formed on a surface of the substrate,
the coating film including an alternate layer,
the alternate layer including a first layer having a first composition and a second layer having a second composition,
the alternate layer being formed by alternately stacking at least one first layer and at least one second layer,
the first layer and the second layer each having a thickness not smaller than 2 nm and not greater than 100 nm,
the first composition being expressed as $Ti_aAl_bSi_cN$ ($0.25 \leq a \leq 0.45$, $0.55 \leq b \leq 0.75$, $0.01 \leq c \leq 0.05$, $a+b+c=1$),
the second composition being expressed as $Ti_dAl_eSi_fN$ ($0.35 \leq d \leq 0.55$, $0.45 \leq e \leq 0.65$, $0.01 \leq f \leq 0.05$, $d+e+f=1$), and
the first composition and the second composition satisfying a condition of $0.05 \leq d-a \leq 0.2$ and $0.05 \leq b-e \leq 0.2$.

7. The surface-coated cutting tool according to claim 6, wherein
a total number of the first layer and the second layer included in the alternate layer is not smaller than 20 and not greater than 500.

* * * * *